(12) United States Patent
Kannan et al.

(10) Patent No.: US 9,886,529 B2
(45) Date of Patent: Feb. 6, 2018

(54) METHODS AND SYSTEMS FOR FEATURE RECOGNITION

(71) Applicant: GEOMETRIC LIMITED, Vikhroli (W), Mumbai (IN)

(72) Inventors: Thoguluva Ramamoorthy Kannan, Chennai (IN); Deepti Gupta, Mumbai (IN)

(73) Assignee: HCL Technologies Limited, New Delhi (IN)

( * ) Notice: Subject to any disclaimer, the term of this patent is extended or adjusted under 35 U.S.C. 154(b) by 772 days.

(21) Appl. No.: 14/471,666

(22) Filed: Aug. 28, 2014

(65) Prior Publication Data
US 2016/0063136 A1    Mar. 3, 2016

(51) Int. Cl.
*G06F 17/50*    (2006.01)
*G06T 17/10*    (2006.01)

(52) U.S. Cl.
CPC .............. *G06F 17/50* (2013.01); *G06T 17/10* (2013.01)

(58) Field of Classification Search
CPC ...................................... G06F 17/50
USPC ............................................................ 703/1
See application file for complete search history.

(56) References Cited

U.S. PATENT DOCUMENTS

| | | |
|---|---|---|
| 6,597,355 B1 | 7/2003 | Kulkarni |
| 6,760,038 B2 | 7/2004 | Venkataraman et al. |
| 7,042,451 B2 | 5/2006 | Venkataraman et al. |
| 2003/0214503 A1* | 11/2003 | Venkataraman ....... G06K 9/469 345/420 |
| 2010/0138195 A1* | 6/2010 | Onodera ................. G06T 17/20 703/1 |

OTHER PUBLICATIONS

Regli, et al., Recognition of Volumetric Features from CAD Models Problem Formalization and Algorithms, 1993, Department of Computer Science and Institute for Systems Research, University of Maryland, pp. 1-26.*
Kusiak, Computational Intelligence in Design and Manufacturing, 1992, pp. 71, 72, Wiley, CA.
Shah, Parametric and Feature-Based CAD/CAM: Concepts, Techniques, and Applications, 1995, p. 97, Wiley, CA.

(Continued)

*Primary Examiner* — Timothy A Mudrick
(74) *Attorney, Agent, or Firm* — Brooks Kushman P.C.

(57) ABSTRACT

A computer-implemented product including instructions embodied in a non-transitory computer read-able medium that, when executed by a processor, cause the processor to receive input selecting one of a plurality of faces of a boundary representation model of an object. The computer-implemented product may include further instructions to identify boundary edges of the model outside the one of the faces not separated from the one of the faces by an intervening concave or convex edge. The boundary edges may define a perimeter of a topological feature containing the one of the faces. The computer-implemented product may include further instructions to identify a set of the faces including the one of the faces contained by the perimeter and generate output highlighting the boundary edges and set of the faces of the topological feature.

20 Claims, 12 Drawing Sheets

(56) References Cited

OTHER PUBLICATIONS

Qiang et al., Machine Interpretation of CAD Data for Manufacturing Applications, 1997, pp. 264-311, vol. 24, No. 3, University of Arizona, Tucson.

Kannan, An Integrated Planner for Manufacture of Sheet Metal components Using Step AP-203, Thesis submitted for the award of the degree of Doctor of Philosophy, 2007, Manufacturing Engineering Section Department of Mechanical Engineering Indian Institute of Technology Madras Chennai, India.

* cited by examiner

METHODS AND SYSTEMS FOR FEATURE RECOGNITION

TECHNICAL FIELD

The present disclosure relates generally to methods for recognizing features from three-dimensional models for application in various domains, such as design, analysis, manufacturing, prototyping, manufacturability analysis, assembly, costing, sustainability, etc., in which such features may be of use.

BACKGROUND

Solid modeling is a term that refers to a set of techniques that may be used to create and store computer based representations of physical objects. A number of techniques have evolved over the years for providing computer-based representations of three-dimensional parts. One of these techniques is Boundary Representation (B-rep).

A B-rep model of a mechanical part consists of a set of "faces," "edges," and "vertices," which are connected together to form a topological structure of the part. By using such a representation, it is possible to evaluate many properties of the part from its computer model. These include the mass, the volume, the moments of inertia and products of inertia and other geometric information like face adjacencies, outer loop and inner loop of faces, face data, edge data, and vertex data. Additionally, such models enable computer-based analysis of stress and strains in the part under different loading conditions, manufacturability analysis, tool path generation, etc. B-rep modeling is a popular method of representing solid models. Other representations of solid models are also known in the art.

Software based on solid modeling is widely used by engineers to create models of parts that may eventually be manufactured. Software such as SolidWorks (Solidworks Corporation), Pro/Engineer (Parametric Technology), CATIA (Dassault systems), NX (Siemens), Inventor (AutoDesk) are examples of solid modeling software.

Traditionally, work in feature technology has mainly focused in two areas: feature based design and feature recognition. In feature-based design, the basic unit is a feature that is defined as a region of design or manufacturing interest in a part. Most CAD systems provide a suite of standard features such as holes, ribs, extruded/revolved depressions, and protrusions for designing parts. The parts are designed as sequences of these features, and are represented as a design tree (or feature tree). However for many applications, the design tree may not provide the required information directly. For example in manufacturing, protrusions in a feature tree need to be mapped as slots with islands while generating the tool path for machining. Further, the actual feature in the part may not correspond exactly to the feature in the design history due to feature interactions. For example, a blind hole could become a through hole due to the imposition of other features. In such situations, the only approach is to use feature recognition from the part model. In a few situations, one encounters models that do not have any feature information. This could result from modeling in non-feature based systems or from translation of data from one CAD system to another. In such cases, feature recognition is essential to extract the necessary information.

In the area of feature recognition, many techniques have been proposed and implemented. For a comprehensive review of feature recognition techniques, reference is made to Qiang Ji and Michael M. Marefat (Ji et al); "Machine Interpretation of CAD Data for Manufacturing Applications," ACM Computing Surveys, Vol. 24, No. 3, September 1997.

Several of the techniques described in Ji et al reference the use of graph-based approaches for recognizing features. In the graph-based approach, features are represented using an attributed face-adjacency graph. The graph is constructed by using faces as nodes and edges as arcs. In addition, attributes are added to nodes and arcs representing the topological and geometric characteristics of the corresponding faces and edges.

Feature recognition proceeds by matching the feature graph to an appropriate subgraph of the graph representation of the part. However, a graph-based approach tends to be computationally expensive, especially in the presence of feature interactions, since it involves sub-graph matching problems. The efficiency is hence dependent on the attributes used in the graph that aid in pruning down the search during recognition. Further, many of the approaches proposed so far use feature hints that depend on specific feature types that may not be generally applicable.

SUMMARY

A computer-implemented product includes instructions embodied in a non-transitory computer read-able medium that, when executed by a processor, cause the processor to receive input selecting one of a plurality of faces of a boundary representation model of an object. The computer-implemented product further includes instructions that cause the processor to identify boundary edges of the model outside the one of the faces not separated from the one of the faces by an intervening concave or convex edge. The boundary edges may define a perimeter of a topological feature containing the one of the faces. The computer-implemented product further includes instructions that cause the processor to identify a set of the faces including the one of the faces contained by the perimeter, and to generate output highlighting the boundary edges and set of the faces of the topological feature.

A computer-aided design tool comprises at least one processor configured to receive a boundary representation model of an object, to receive input selecting one of a plurality of faces of the boundary representation model of the object, and to identify boundary edges of the model outside the one of the faces not separated from the one of the faces by an intervening concave or convex edge. The boundary edges define a perimeter of a topological feature containing the one of the faces. The at least one processor is further configured to identify a set of the faces, including the one of the faces, contained by the perimeter, and to generate output highlighting the boundary edges and set of the faces of the topological feature.

A computer-implemented product includes instructions embodied in a non-transitory computer read-able medium that, when executed by a processor, cause the processor to generate a list of faces comprising a solid model, to identify boundary edges for a plurality of topological features of the solid model from the list of faces, and to identify at least one of the boundary edges as being shared among the topological features. The computer implemented product further includes instructions that cause the processor to, in response to identifying at least one of the boundary edges as being shared, identify the topological features as being common, and in response to user input selecting one of the topological features tagged as being common, to generate output highlighting the other of the topological features tagged as being common.

DETAILED DESCRIPTION

Figure 1:
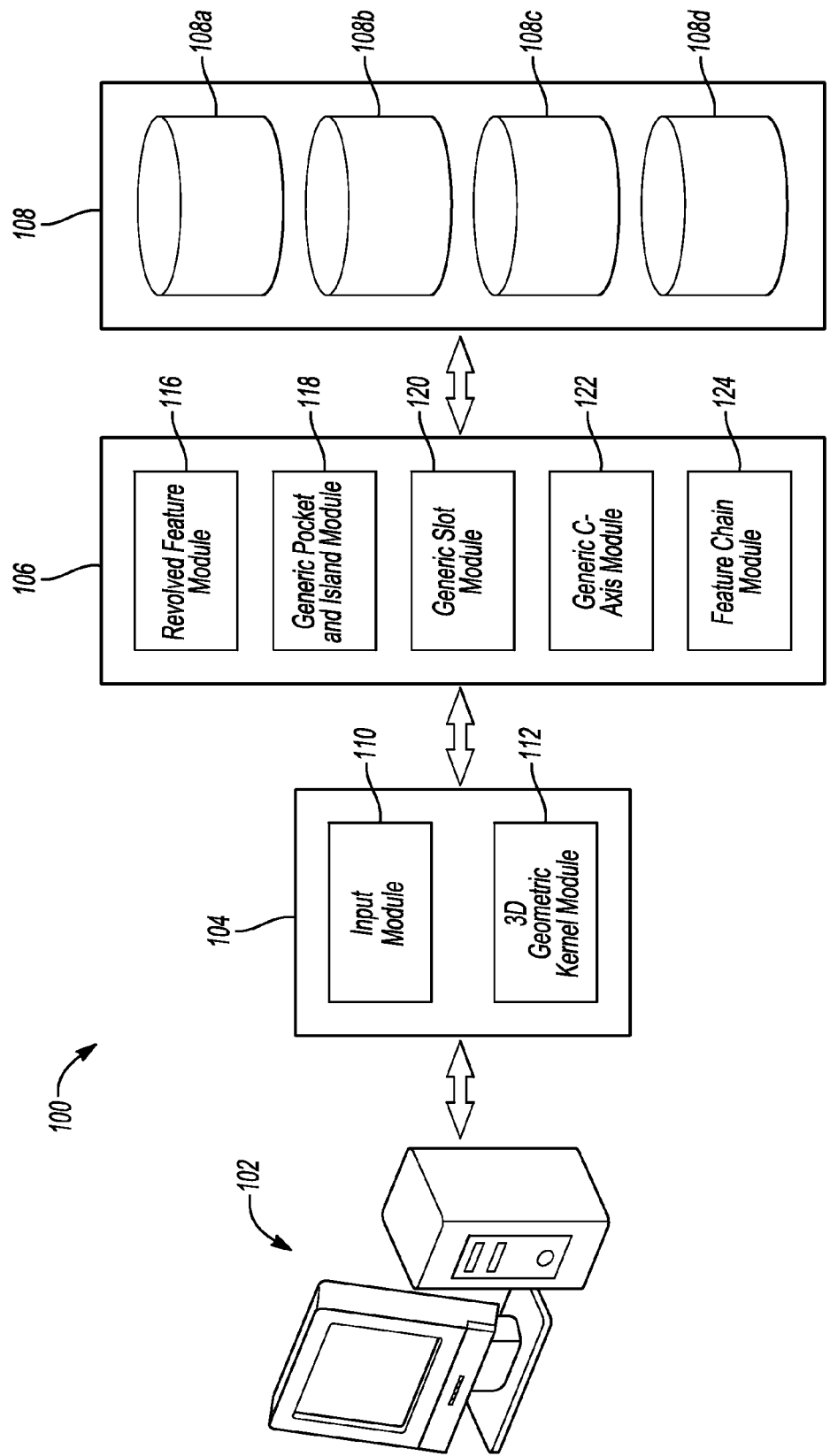
FIG. 1 is an exemplary block topology of a feature recognition system.

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the embodiments. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

The embodiments of the present disclosure generally provide for a plurality of circuits or other electrical devices. All references to the circuits and other electrical devices and the functionality provided by each, are not intended to be limited to encompassing only what is illustrated and described herein. While particular labels may be assigned to the various circuits or other electrical devices disclosed, such labels are not intended to limit the scope of operation for the circuits and the other electrical devices. Such circuits and other electrical devices may be combined with each other and/or separated in any manner based on the particular type of electrical implementation that is desired. It is recognized that any circuit or other electrical device disclosed herein may include any number of microprocessors, integrated circuits, memory devices (e.g., FLASH, random access memory (RAM), read only memory (ROM), electrically programmable read only memory (EPROM), electrically erasable programmable read only memory (EEPROM), or other suitable variants thereof) and software which co-act with one another to perform operation(s) disclosed herein. In addition, any one or more of the electric devices may be configured to execute a computer-program that is embodied in a non-transitory computer readable medium that is programmed to perform any number of the functions as disclosed.

This disclosure proposes a system and method to provide a frame work for defining and recognizing features, in particular, generic features, in Boundary Representation (B-rep) models. The B-Rep model represents three-dimensional (3D) model data by bounding surfaces. It contains model information in the form of solids, faces, edges, and vertices. A solid is a bounded volume of multiple faces. The face data may contain surfaces like planar, cylindrical, spherical, toroidal, conical or spline surfaces, etc. The faces may contain bounding loops formed by edges like lines, circles, arcs, splines, etc. The faces may have several bounding loops, an outer loop that represents an outer boundary of a surface and inner loops that represent holes in the face. The inner loop may be a clue used for the feature recognition method explained in this disclosure.

The disclosure may include software modules (i.e., algorithms) which operate on B-rep solid models and which are executed on a local computer, a computer communicating in a network, a computer communicating with a server, and/or a combination thereof. The modules may be implemented in any programming language including, but not limited to, C or C++, and may use local operators from known geometric modeling kernels.

FIG. 1 is an exemplary block topology of a feature recognition system. The feature recognition system 100 may have hardware architecture for executing a feature recognition analysis software used for product development and manufacturing. The software system 100 may be web-based and/or executed on hardware of a local computer. The software system 100 may include product development methods that integrate one or more computer-aided designs (CAD) and/or computer-aided manufacturing (CAM) models. The system may include, but is not limited to, a computer 102, initial processing algorithms 104, feature recognition algorithms 106, and a database 108. The one or more algorithms may be executed on hardware at the computer 102 and/or at a remote server in communication with the computer 102. The system 100 may be a tool operated for analysis of one or more models.

For example, the system 100 architecture may be a web-based software working over an internet and/or intranet allowing worldwide access to one or more facilities across the globe. The primary requirement of the computer 102 is that it has access to the feature recognition software (library executable file). The software may reside at a host location which is located on a customer server with access to a server manager and any computer 102 that has a browser with access to the internet and/or intranet. The system 100 architecture may allow a user to create an enterprise specific knowledge database bank 108 allowing for feature recognition analysis to cross reference a technical specification, a specific customer requirement, and/or other product manufacturing requirements.

The database bank 108 may include several databases to store data input, technical requirements and specifications, and feature recognition algorithms. For example, the database bank 108 may include, but is not limited to, a revolved feature database 108a, a pocket and island database 108b, a slot database 108c, and a feature chain database 108d. The database bank 108 may store the feature recognition algorithms so that the system 100 may update the feature recognition software based on software updates, user input, and/or historical data generated during execution of the one or more algorithms.

The system 100 architecture network may include, but is not limited to, a server (not shown), one or more processors (not shown), one or more computer systems (e.g., computer 102), and software executed on the computer 102 hardware. The system 100 may be designed as a standalone system. The one or more computer systems 102 may be located at an individual user site having a single office, or several offices globally located.

In one embodiment, the system 100 architecture may include, but is not limited to, a webserver (not shown), a database 108, initial processing algorithms 104, and one or more computer systems 102. The webserver may comprise a processor, RAM, a hard disk drive, and the necessary server software. The database 108 may include, but is not limited to, a relational database management system (e.g. Microsoft SQL server) having a processor, RAM, a hard disk, and an operating system software. The one or more computer systems 102 comprise at least one processor, RAM, browser, and internet/intranet software requirements.

The initial processing algorithms may be located at the computer 102 and comprise an input module 110, a three dimensional geometric kernel module 112, and/or a knowledge management module (not shown). The input module 110 may receive one or more B-rep models. The three dimensional geometric kernel module 112 may process the input data format and provide application programming interfaces for geometry inquiry at the computer 102. The knowledge management module may manage the one or more modules and software algorithms in communication with each other to execute the feature recognition system.

The feature recognition software 106 may be a standalone design using only a database system as the backend database manager. The feature recognition algorithms may include, but are not limited to, a revolved feature module 116, a generic pocket and island module 118, a generic slot module 120, a c-axis module 122 and/or a feature chain module 124. The revolved feature module 116 may identify a revolved feature of the part. The generic pocket and island module may identify a pocket and/or island of the part. The generic slot module may identify a slot on the part. The feature chain module may identify one or more connected features of the part.

The feature recognition software 106 may include application programming interfaces allowing software components to interact with other product development, design, and manufacturing applications. The system 100 executing the feature recognition software 106 may communicate with other software via a set of rules for encoding models in a format that is both human-readable and machine-readable. The software may include, but is not limited to, using and/or creating product and manufacturing models based on product and process requirements, manufacturing requirements, detective controls, control (test and detection activities) implementation design details, product details related to FMEAs, problem details related to global 8D method, and final solution and validation design requirements.

For example, the recognition software-based system 100 and method of this disclosure may have the input module 104 receive the B-rep from, for example, one of a solid modeling program (e.g., SolidWorks) or any other source capable of providing a standardized data structure for describing solids. The system 100 and methods disclosed below may identify feature recognition of interacting features of the part.

Feature interactions may result in a parent child relationship between features. Parent child information may provide information such as the order of features to be machined. The parent child information of features that are connected to each other in such a way may influence a machining strategy of each feature while providing an enhanced manufacturing process of the part.

A product development cycle may depend on computer aided design and manufacturing such that the product data is represented as three-dimensional models and/or in two-dimensional orthographic representations. Automation of downstream activities may require relevant information to be retrieved from the three-dimensional model. Generally, such information is manually retrieved and fed for processing. Manual methods may affect productivity and largely rely on individual's capability and judgment, which may not be consistent. The system 100 may provide an automated way of extracting such information and assist in automation and improve productivity. Hence, an automatic method for extraction of such information from a three-dimensional model through features is disclosed and discussed in more detail below.

For example, the three-dimensional model may be generally stored as the B-rep model that serves as a data model. The data model may provide the three-dimensional model data as a whole. The shapes of local regions within the three-dimensional model may contain information relevant to design, manufacturing, costing, etc. The system 100 may identify these local regions using the feature recognition algorithms 106. Depending on the type of information content in the one or more features, they may be classified into various feature types like functional features, form features, design features, manufacturing features, assembly features, tolerance features, inspection features, etc. Many definitions for the term "feature" have been proposed in the literature. A feature represents the engineering meaning or significance of the geometry of a part or assembly as disclosed in Shah, J. J., *Features in Design and Manufacturing, in: Intelligent Design and Manufacturing*, A. Kusiak (ed.), John Wiley & Sons, 1992, and in Shah, J. J. and M. Mantyla, *Parametric and Feature-based CAD/CAM*, John Wiley & Sons: New York, N.Y. 1995. It is generally agreed that features may have attributes that have to do with geometry of the part and attributes that deal with the function they serve in the part as disclosed in Kannan, T. R., *An Integrated Planner For Manufacture of Sheet Metal Components Using STEP AP*-203, Ph.D. Thesis, India Institute of Technology Madras, Chennai, 2007.

The three-dimensional modelers like SolidWorks, Inventor, Pro/E, CATIA, NX, etc. may use some sort of feature based modeling techniques, in which the three-dimensional model may be created by means of features, which adds or subtracts volumes. A feature tree may be listed for a three-dimensional model which stores the historical feature data of a model and is generally accessible through suitable application programming interfaces. Though these models may be feature based, the feature information in these models may not be useful for downstream automation as the features are more of design features and may not provide sufficient information for manufacturing, processing, or costing, etc.

For example, a hole in a part may be manufactured only when the feature information is listed as a hole and includes hole parameters like a hole axis, diameter, height, through or blind hole, bottom angle, etc. The hole may be created in these three-dimensional modelers using multiple methods like hole wizard or extruded cut of a circular sketch or revolved cut of a rectangular sketch, in which the respective features in the feature tree may be listed as a hole or extruded-cut or revolved-cut. For manufacturing, the feature should be identified as a hole irrespective of the design method used. With design feature tree information, it may not be possible to identify extruded-cut or revolved-cut as a hole. Similarly for any model, irrespective of design features used to create the three-dimensional model, features have to be reinterpreted in the form of manufacturing features to facilitate various downstream automation processes. The systems and methods of feature recognition herein may identify feature chains comprising features such as pockets, slots and islands disclosed and discussed in further detail below.

It may also be possible that a three-dimensional model created in any CAD modeler may need to be processed in another CAM system where the CAD and CAM systems are not from the same vendor. To address such cases, most of the CAD/CAM systems may provide options for importing three-dimensional model(s) made from third party software. After importing, however, the three-dimensional model may list only as an imported solid in the feature tree without any feature information. The systems and methods for feature recognition may provide feature information as disclosed and discussed in further detail below.

Figure 2:
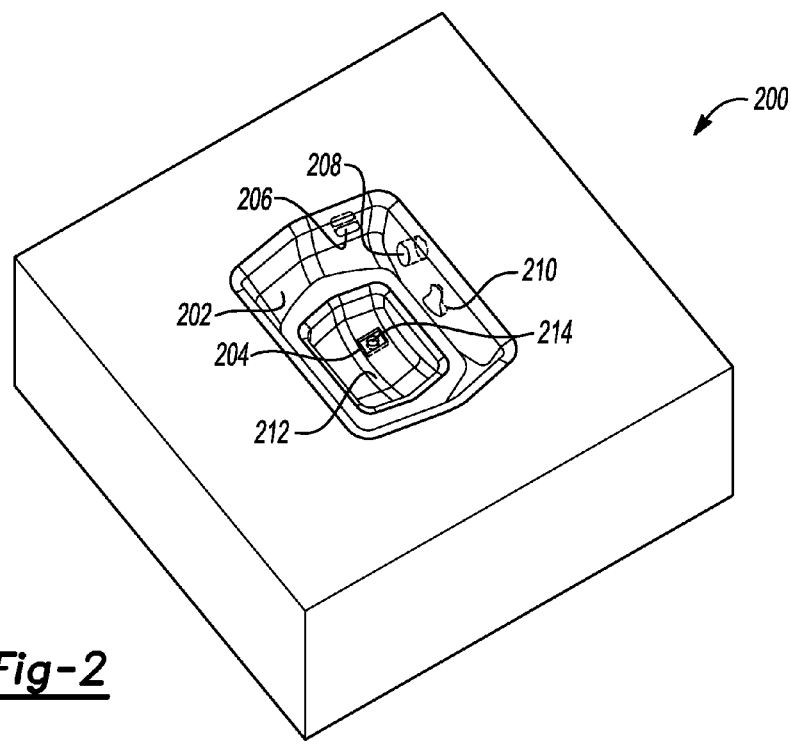
FIG. 2 is an exemplary three-dimensional view of a solid model that contains a feature chain comprising multiple features.

FIG. 2 is an exemplary three-dimensional view of a solid model that contains a feature chain comprising multiple features. The solid model may have one or more features for a specifically designed part and/or component. The one or more features may include, but are not limited to, slots, pockets, islands, other relevant features (e.g., fillets and chamfers that are part of the slots, pockets, and islands), and/or a combination thereof.

A design and manufacturing process may be driven by the solid model. The solid model may be received by the feature recognition software. The feature recognition software may process the solid model to generate a list of recognized features. The list may be provided to one or more application programs for interpretation of these features. The list may be communicated to other application programs with the use of application program interface functions and class-based interfaces.

For example, one or more solid models may be developed to include feature information. If the solid models are converted across CAD systems and/or if the models were created using older generation CAD systems, the feature information may be lost during conversion and/or not available based on the older generation tools. The feature recognition software may receive the one or more solid models and generate feature information. The feature information may include the list of recognized features, information about machinable features, and/or a combination thereof.

The solid model 200 may comprise various types of features including, but not limited to, pockets, slots (steps), and islands. The feature recognition software may generate feature information that includes designs in which more than one pocket is lying inside another pocket as shown in FIG. 2. A pocket may have child pockets in more than one feature faces, two or more pockets in a single feature face, and pockets inside child pockets.

For example, the solid model 200 includes a pocket 202 which contains pockets in three feature faces. One of the feature faces has an obround shaped pocket 206. Another feature face contains two pockets 208 and 210. The third feature face contains a pocket 204 in which one of the feature faces has another rectangular child pocket 212, which further contains a circular child pocket 214. All of these features 202, 204, 206, 208, 210, 212, 214 form a feature chain and the parent child relationship is shown in the form of a graph in FIG. 3 below.

Based on the feature information, the application software using feature recognition software may automatically generate computer numerical control (CNC) instructions for manufacturing of the part or component. The application software using feature recognition software may also generate information to be used by coordinate measuring machines for automated inspection based on the feature information. The application software using feature recognition software may map the feature information onto the CAD system and/or other manufacturing/processing application's feature tree illustrating feature interaction.

Figure 3:
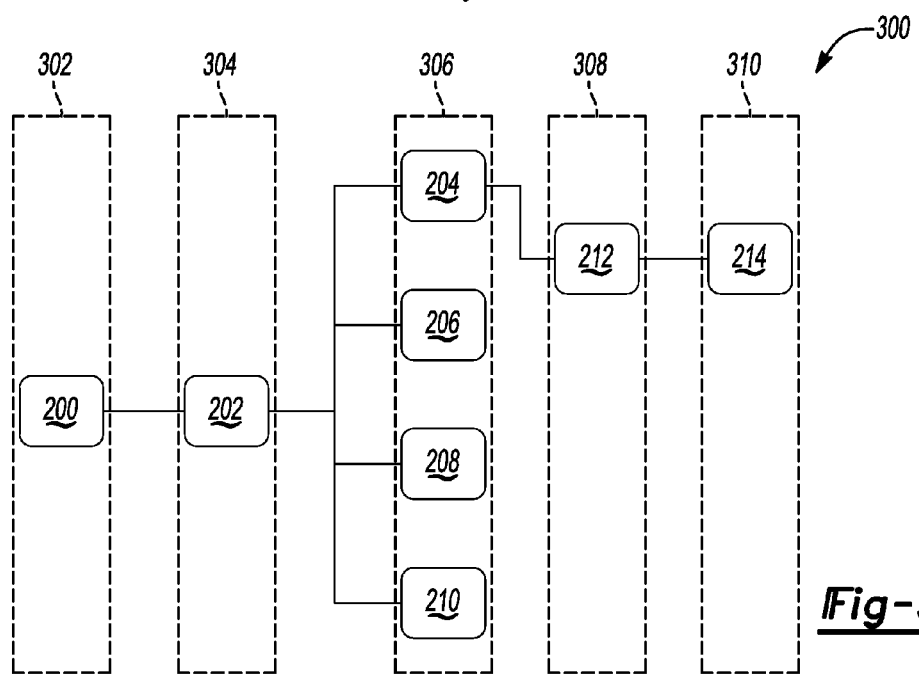
FIG. 3 is a block diagram illustrating a parent child relationship of a feature chain containing multiple features as shown in FIG. 2.

FIG. 3 is a flow chart illustrating a parent child relationship of the feature chain 300 containing multiple features as shown in FIG. 2. Based on the solid model 200, the feature recognition software may determine the parent child relationship of features and output the feature chain 300.

For example, the feature chain 300 for the solid model 200 may be illustrated as a single feature chain having multiple levels. The recognition software may output a first level 302 illustrating the solid model 200 selected for generating the feature chain 300. The single feature chain 300 illustrates a pocket 202 as a parent feature at a second level 304. The pocket 202 comprises child features in three feature faces. The child features of the parent pocket 202 are illustrated at a third level 306. The child features in the third level 306 includes a pocket 204 at one face, an obround shaped pocket 206 at a second face, and two pockets 208 and 210 at a third face.

The pocket 204 at the second face may comprise another rectangular child pocket 212 as illustrated in a fourth level 308 of the single feature chain 300. The rectangular child pocket 212 may comprise a circular child pocket 214 as illustrated in a fifth level 310 of the single feature chain 300.

The feature chain 300 may provide information for generating a processing strategy comprising a particular sequence for machining the features based on the parent child relationship. The feature chain 300 may provide the feature information of individual features such as the set of faces that form a feature. The feature chain 300 comprising the parent child information may provide the order of features to be machined and information of features that are connected to each other in such a way that they influence machining strategy of each other. For example, the machining strategy for the pocket 204 may now be influenced in response to the rectangular pocket 212 and the circular child pocket 214 in the solid model 200 based on the feature information of the feature chain 300.

Figure 4:
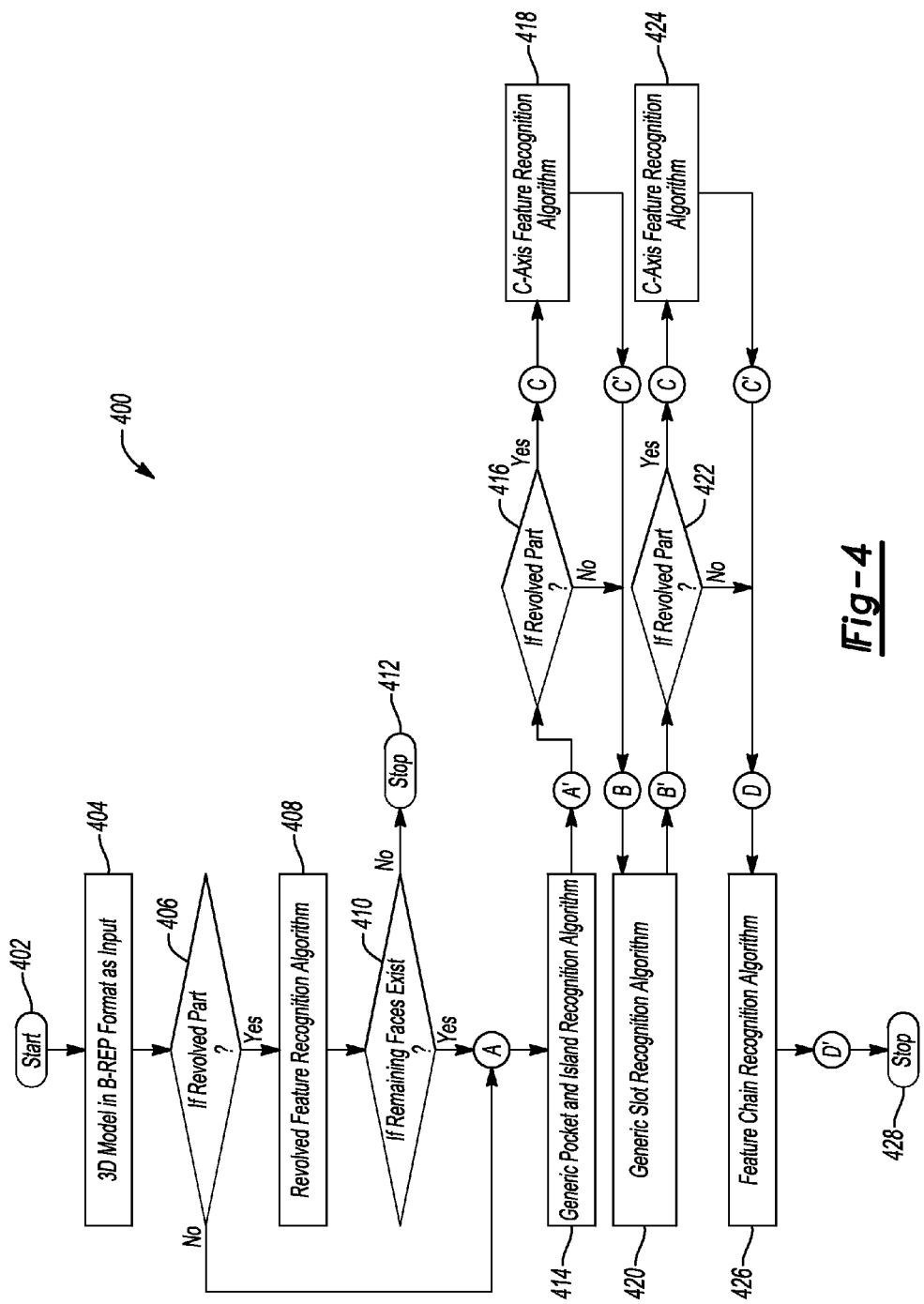
FIG. 4 is a flow chart of a feature recognition method.

FIG. 4 is a flow chart of a feature recognition method 400 according to an embodiment. The method 400 may be implemented using software code contained within the feature recognition executable. In other embodiments, the method 400 may be implemented on a controller (processor), implemented at a server in communication with the controller, and/or a combination thereof.

Referring again to FIG. 4, the feature recognition method and its components illustrated in FIG. 1 are referenced throughout the discussion of the methods to facilitate an understanding of various aspects of the present disclosure. The method 400 of recognizing features of a solid model while communicating with one or more development and manufacturing computer-aided tools may be implemented through a computer algorithm, machine executable code, or software instructions programmed into a suitable programmable logic device(s) of the controller, such as the controller of a computer, the one or more controllers at a server, or a combination thereof. Although the various operations shown in the flowchart diagram 400 appear to occur in a chronological sequence, at least some of the operations may occur in a different order, and some operations may be performed concurrently or not at all.

In operation 402, the one or more processors may be initialized to begin execution of the recognition method. For example, a CAD and/or CAM application may initialize the feature recognition method by calling a library containing the feature recognition tool. In other embodiments the feature recognition method may be embedded in several formats including, but not limited to, software executable, a library, a dynamic link library, and/or may be a part of an application as direct source code.

In operation 404, the feature recognition software may receive three-dimensional model data in a B-rep format as input. The feature recognition software may receive and process the geometry and topology data generated by any three-dimensional geometry kernel based on the three-dimensional model.

In operation 406, the feature recognition software may determine if the model is a revolved part based on a cylindrical surface. For example, the software may recognize the revolved feature based on several features including, but not limited to, a reference cylindrical surface and a turn axis. If the model is a revolved part, then it is processed by a revolved feature recognition algorithm in operation 408.

The revolved feature recognition module may identify the axis of the cylindrical surface and tag the axis as a part axis. The revolved feature recognition model may segregate and tag faces belonging to the revolved feature based on cylindrical faces in the model comprising the same axis as the part axis. These faces are cylindrical feature faces. The adjacent faces on both sides of these cylindrical surfaces may be identified. The adjacent face may be a conical face (frustum) or planar face, which may be connected to another cylindrical feature face with either smaller or larger diameter. This cylindrical feature face may further be connected to a conical face or planar face, which may be connected to another cylindrical feature face. There may be a chance that such an adjacent face may be a full cone or a planar face without an inner loop, or that the adjacent face specifies the end face on one side. All of these faces may also be tagged as revolved feature faces by the revolved feature recognition module.

In operation 410, the feature recognition software may determine if the model has additional faces. If the software does not recognize additional faces, the software may stop processing the model in operation 412. The remaining faces are further processed by consecutive algorithms for recognition of other features.

In operation 414, if the three-dimensional model is not a revolved feature, then the model data is directly sent to a generic pocket and island recognition algorithm. The software may determine generic pocket and island based on inner loops, and concavity and convexity of inner loop co-edges. The software may tag the feature faces of the generic pocket and island inner loops. The generic pocket and island recognition module may generate an output. The generic pocket and island recognition module is discussed in further detail in FIG. 5.

In operation 416, the feature recognition software may determine if the pocket(s) and/or island(s) are in a revolved part. If the pocket(s) and/or island(s) are in a revolved part, the software may further process the recognized features using a C-axis feature recognition algorithm in operation 418.

For example, the C-axis feature recognition module may classify the recognized features into C-axis pockets and C-axis islands based on a cylindrical bottom face or a cylindrical top face comprising the same axis as the part axis for the pockets and islands respectively. The lateral feature faces are further checked whether they converge to meet the part axis, which may be verified by co-planarity of the part axis, projected vertex of multiple sample points of a bottom co-edge on the part axis, and a direction vector of sample points of the bottom co-edge with respect to nearest points in a top edge of the lateral feature faces. The C-axis feature recognition module may generate an output. The C-axis recognition module is discussed in further detail in FIG. 7.

In operation 420, the remaining faces, if any, are further processed by a generic slot recognition algorithm. The generic slot recognition module determines where a slot is recognized based on concavity and convexity of edges, adjacency of faces and convex fillets. The module implements the fillet recognition method to recognize fillets as disclosed in U.S. Pat. No. 6,597,355, the contents of which are hereby incorporated by reference. The generic slot recognition module may generate an output. The generic slot recognition module is discussed in further detail in FIG. 6.

In operation 422, the feature recognition software may determine if the slot is in a revolved part. If the slot(s) are in a revolved part, the software may further process the recognized parts using a C-axis feature recognition module in operation 424.

For example, the C-axis feature recognition module may classify the slots in the revolved part as a C-axis slot based on a cylindrical bottom face or a cylindrical top face having a same axis as the part axis for the slot. The lateral feature faces are further checked whether they converge to meet the part axis, which is verified by co-planarity of part axis, projected vertex of multiple sample points of a bottom co-edge on the part axis and a direction vector of sample points of the bottom co-edge with respect to nearest points in a top edge of the lateral feature faces. The C-axis feature recognition module may generate an output. The C-axis recognition module is discussed in further detail in FIG. 7.

In operation 426, the recognized features such as pockets, islands, slots and C-axis features are further processed by a feature chain recognition algorithm. The feature chain recognition module determines where features are integrated as feature chains based on feature adjacency, inner loops in feature faces, shared fillets, and/or a combination thereof. The feature chain recognition module may generate a parent child relationship based on the integrated features. The feature chain recognition algorithm may generate an output to one or more computer-aided design and manufacturing applications. The feature chain recognition algorithm is discussed in further detail in FIG. 8.

The feature recognition software may transmit the output results from the one or more module to a product and/or manufacturing analysis tool (e.g., CAD, CAM, etc.). The feature recognition software may be disabled based on a completed analysis, a request received by an analysis tool, and/or a request received by user input in operation 428.

Figure 5:
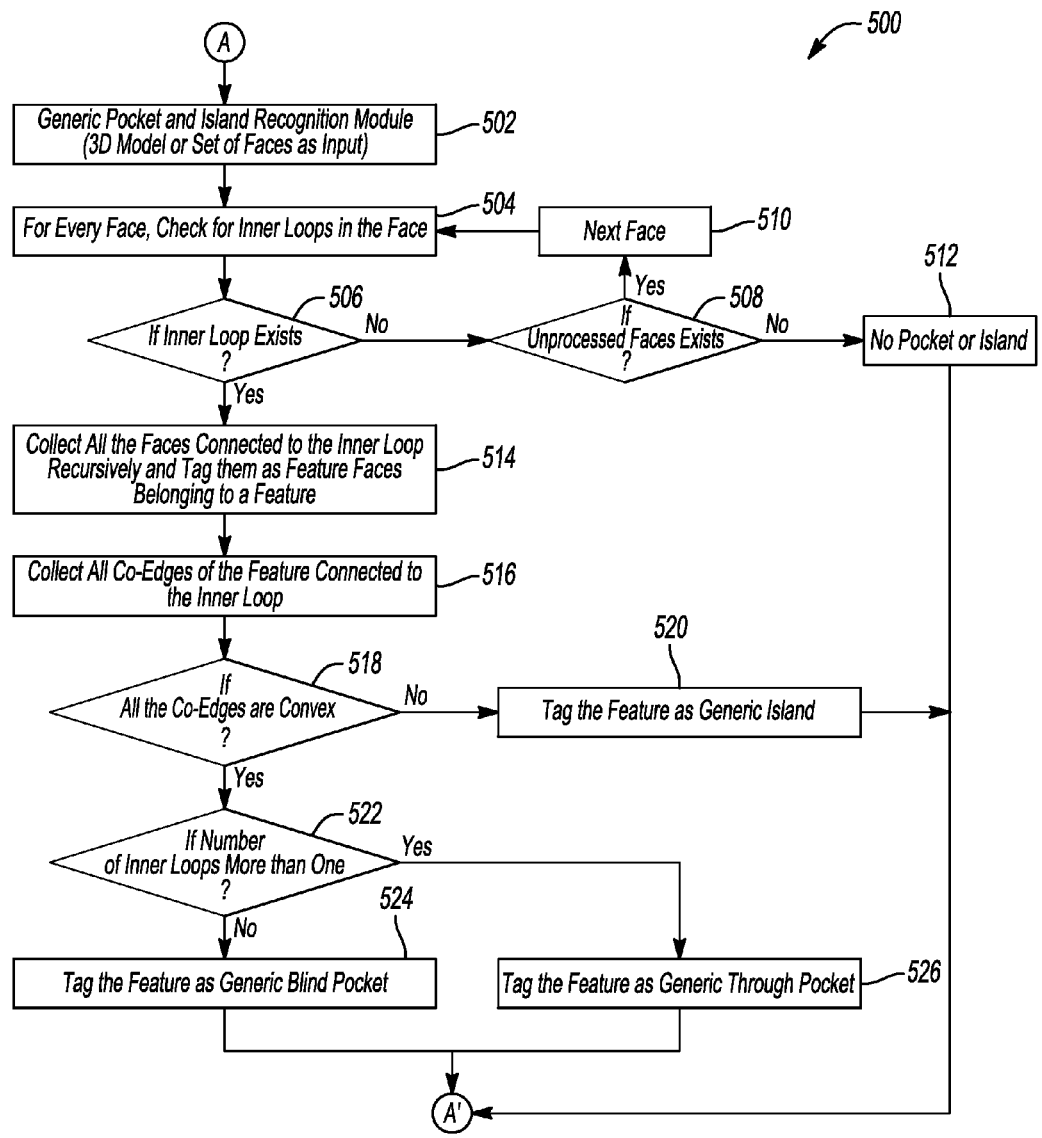
FIG. 5 is a flow chart of a pocket and island recognition method.

FIG. 5 is a flow chart of a pocket and island recognition method 500. The pocket and island recognition method may receive a request from the feature recognition software to perform analysis on the solid model. The pocket and island recognition method comprises a process that receives the three-dimensional model data to check whether one or more faces have any inner loops in operation 502.

In operation 504, the method checks for inner loops in the one or more faces of the solid model. The method may check to see if an inner loop exists in the three-dimensional model in operation 506.

In operation 508, if an inner loop does not exist, the method may determine whether the one or more faces exists and are unprocessed. If there are other faces that exist and are waiting for processing, the method may continue to check for inner loops in the next face in operation 510. If no faces are unprocessed, and no inner loops exist, the method may determine that no pocket or island is present on the solid model in operation 512.

In operation 514, the method may encounter an inner loop and collect all the faces (first level faces) connected to the inner loop recursively. The method may tag all the faces connected to the inner loop as feature faces belonging to a feature. Then the faces that are attached to the first level faces are also collected and added to the feature faces. This process is continued recursively until no more adjacent faces are left to collect and this cluster of faces forms a feature. Once a face is collected, it is tagged as belonging to a feature. While checking adjacency, only faces that do not belong to any feature is collected further to avoid indefinite looping due to cyclic adjacency of faces.

In operation 516, the method may collect all co-edges of the feature connected to the inner loop. The method may determine if the co-edges attached to the inner loop are concave in operation 518. If the inner loop is concave then the feature is classified as a generic island feature in operation 520.

The method may determine if the co-edges attached to the inner loop are convex, then the feature is classified as a generic pocket feature. The methods may recognize various types of 2.5D pockets effectively including various hole types, as well as three-dimensional pockets. All these features are identified as generic pockets. The methods may determine 2.5D islands and 3D islands as generic islands. Generic pockets may be blind pockets or through pockets.

In operation 522, the method may determine a blind and through pocket classification with the fact that blind pockets have one inner loop and through pockets have two or more inner loops. While collecting the connected faces recursively by starting from an inner loop, if the feature faces are connected to another inner loop, then the face containing the inner loop is not collected as a feature face. Only faces connected to outer loops of other faces are collected recursively. This check is mainly to avoid a whole model getting recognized as a through pocket as all the faces are connected through these two inner loops and may get collected as a single feature, which is not desired. Limiting the recursive collection to only outer loop connectivity effectively avoids this issue.

In operation 526, when the cluster of feature faces are connected to two or more inner loops, then the feature is classified as a generic through pocket. If the feature has only one inner loop, then it is classified as a generic blind pocket in operation 524. Though this method covers a large number of through pockets, there are cases where a through pocket has only one inner loop due to feature interactions. Such features are recognized as a feature chain. The output of the pocket and island recognition method may be transmitted to the feature recognition method 400.

Figure 6:
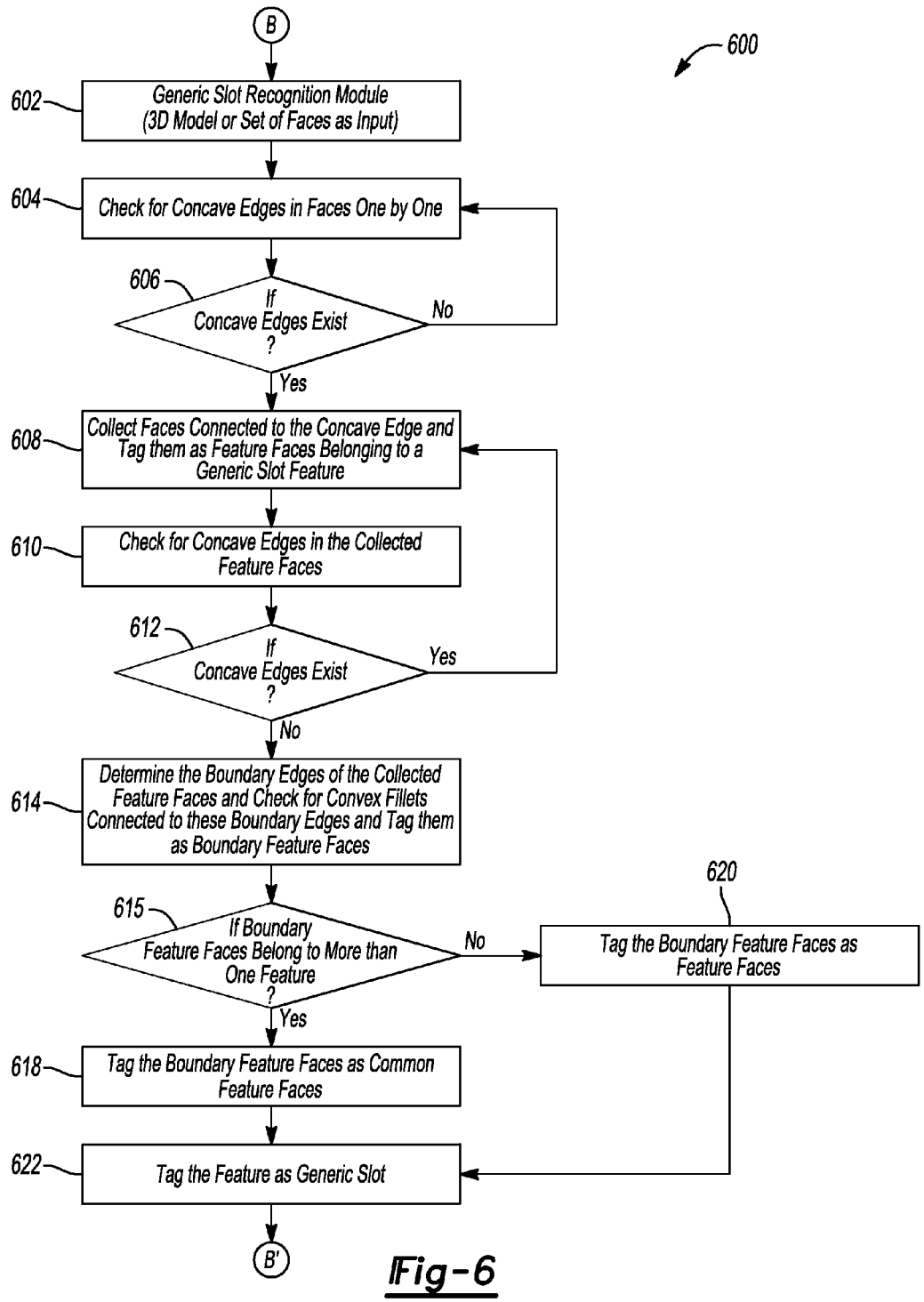
FIG. 6 is a flow chart of a slot recognition method according to an embodiment.

FIG. 6 is a flow chart of a slot recognition method 600 according to an embodiment. The slot recognition method may receive a request from the feature recognition software to perform analysis on the solid model. The slot recognition method comprises a process that receives the three-dimensional model data and/or the set of faces as input in operation 602.

In operation 604, after identifying all the pockets and islands, the remaining faces in the three-dimensional model are processed to check whether there are any concave edges. The method may check each face one by one to determine if a concave edge exists in operation 606.

In operation 608, upon encountering a concave edge, the faces that are directly attached to the concave edge are collected and tagged as faces that belong to a feature. The method verifies whether any of the collected feature faces comprise any other concave edges in operation 610. If the method detects that concave edges exist in the collected feature faces, it may request that the concave edges be added to the feature faces in operation 612. This process is continued recursively until no more adjacent concave edges are left to collect.

For example while checking adjacency, only faces that do not belong to a feature are collected further to avoid indefinite looping due to cyclic adjacency of faces. For a slot feature, the above method would collect the faces without convex fillets around the feature boundary that are expected to be a part of the slot. So, an additional operation may be added to the method to collect these fillets.

In operation 614, the method may identify the boundary edges of the collected feature faces and check for convex fillets connected to these boundary edges and tag them as boundary feature faces. While the method 600 is checking for convex fillets connected to bounding edges of feature faces, all convex fillets are checked even if they are already tagged as boundary feature faces of other features.

In operation 616, the method 600 checks whether the boundary feature faces belong to more than one feature. If the boundary faces belong to more than one feature, the boundary feature faces are tagged as common feature faces in operation 618.

In operation 620, if the boundary faces belong to only one feature, the boundary feature faces are tagged as feature faces of corresponding features. Common feature faces are tagged as feature faces of all the features sharing these fillets. All the feature faces and common feature faces are tagged as belonging to the slot feature in operation 622. The output of the slot recognition method may be transmitted to the feature recognition method.

Figure 11:
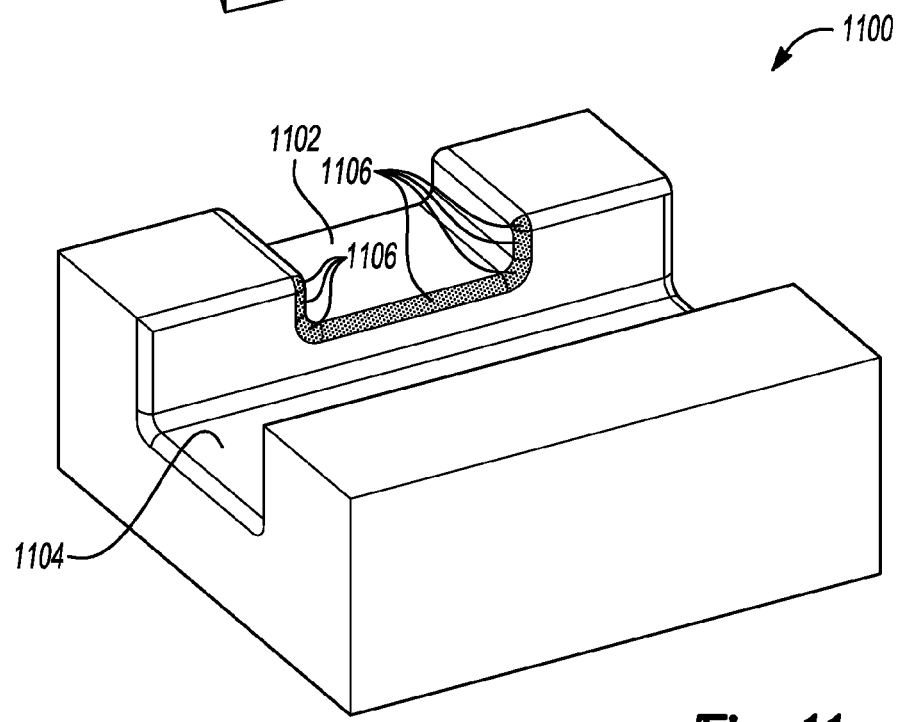
FIG. 11 is a solid model comprising features sharing a common convex fillet.

This method effectively collects all the feature faces as a slot feature as shown in FIG. 11 below. There may be more than one slot feature in the three-dimensional model and hence the remaining faces are checked further for any concave edge or concave fillet and the same process may be repeated.

FIG. 11 is a solid model 1100 having features sharing a common convex fillet. The solid model has a first slot 1102 and a second slot 1104 sharing few convex fillets 1106. The convex fillets 1106 are common to both slot features 1102, 1104 and appear as feature faces for both features. This information is given so that during downstream operations a user may handle these faces accordingly, for example, to machine common fillets either with the first slot feature 1102 or with the second slot feature 1104 depending on the machining strategy adopted. This may avoid common fillets getting machined two times, which is redundant.

Figure 7:
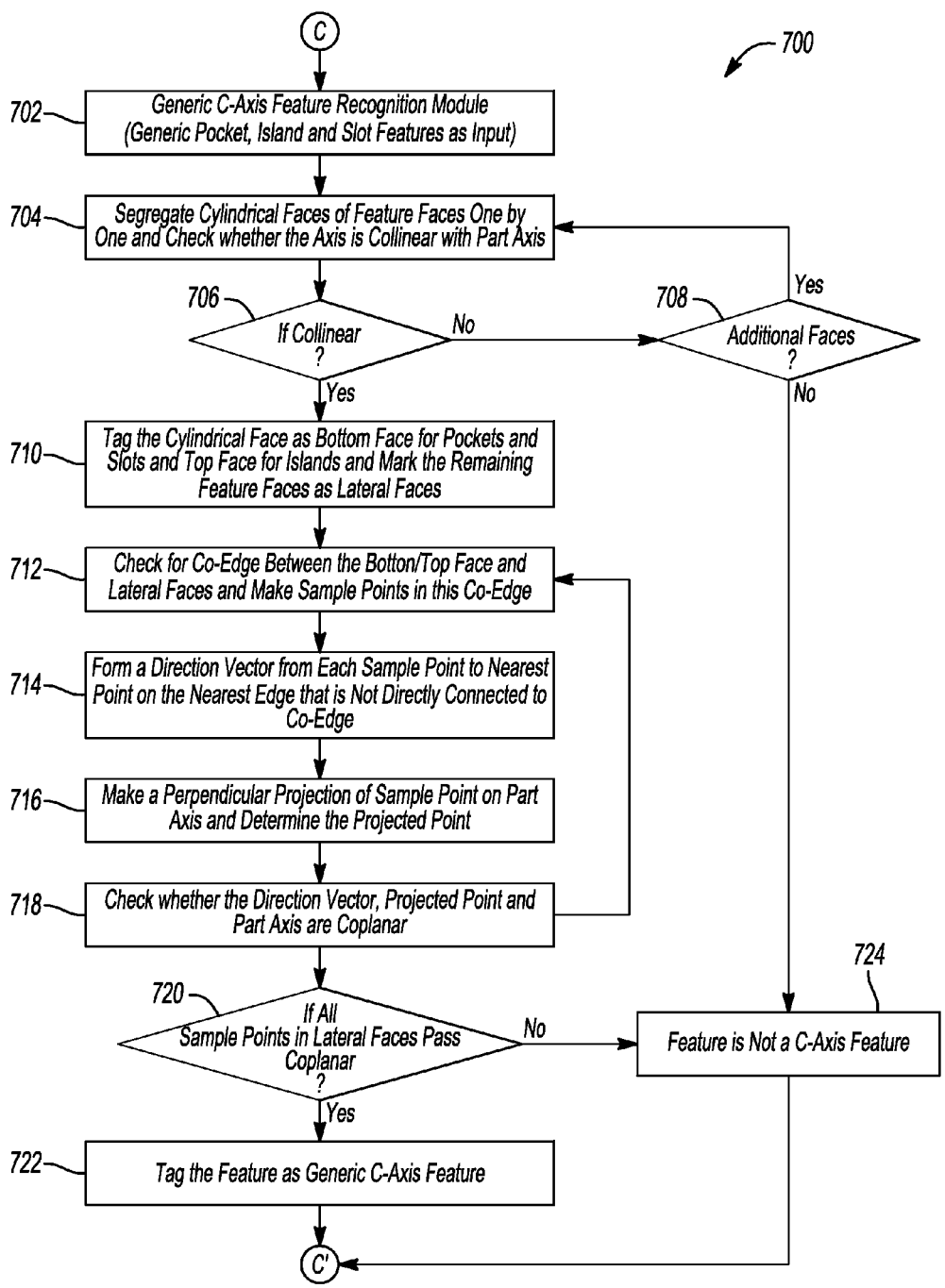
FIG. 7 is a flow chart of a c-axis feature recognition method.
Figure 12:
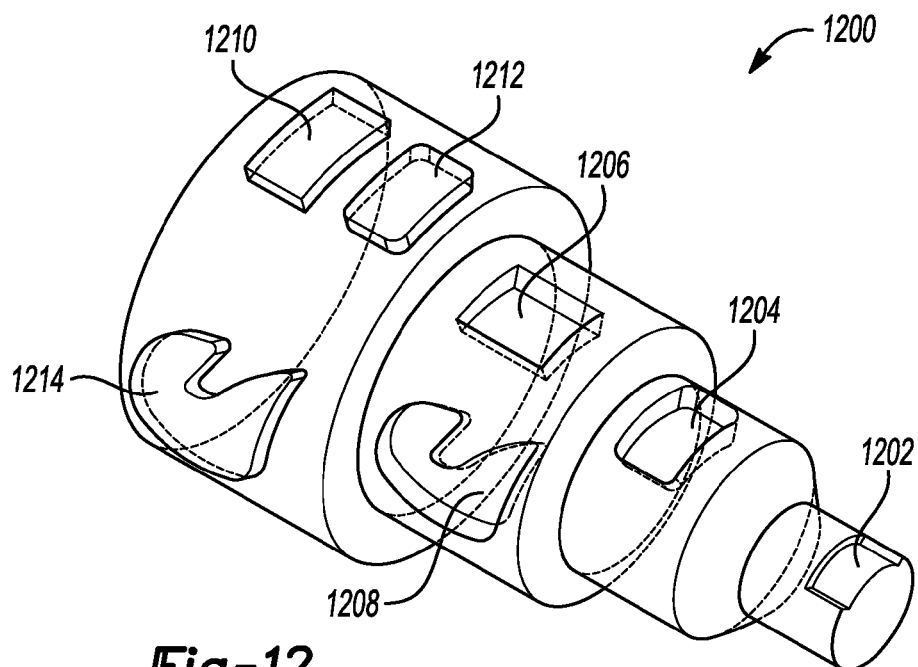
FIG. 12 is a three-dimensional view of a solid model that contains a revolved part with a revolved feature with pockets, islands, and a slot.

FIG. 7 is a flow chart of a C-axis feature recognition method 700 according to an embodiment. A revolved part is another group of parts that requires a different type of design, manufacturing, and other downstream applications. Such parts mostly consist of at least one of a revolved feature and a revolved feature with pockets, islands and slots as shown in FIG. 12. The pockets, islands, and a slot in a revolved feature may be slightly different in the sense that bottom faces of pockets and slots and a top face of islands are cylindrical and have the same axis as a part axis, and lateral feature faces converge to the part axis. Such features may be referred to as wrap features or C-axis features. The term C-axis feature comes from the fact that such features may be machined in a mill-turn machine with a Z-axis, X-axis, and C-axis control.

For revolved parts or mill-turn parts, the revolved feature and the part axis is initially identified. The revolved feature is identified by taking a cylindrical surface as an input, which is manually selected by the user. The axis of this cylindrical surface is identified as a part axis. All the faces that are recognized as part of revolved feature are tagged as revolved feature faces.

The feature recognition method discloses the process for recognition of generic C-axis features. After recognition of a revolved feature, the remaining faces are processed by generic pocket, generic island, and generic slot methods disclosed above and respective features are identified.

In operation 702, the C-axis feature recognition method comprises a process that receives the generic pocket, island, and/or slot features as input to check whether the one or more features are C-axis features. The method may segregate cylindrical faces of a feature face one by one to check whether the cylindrical axis is collinear with the part axis in operation 704.

In operation 706, the method may check each cylindrical face one by one to determine whether the cylindrical axis is collinear with the part axis. If the axis is not collinear with the part axis, the method may proceed to the next unprocessed cylindrical feature face in operation 708.

In operation 710, if the cylindrical face has an axis that is collinear with the part axis, the method may tag the cylindrical face as a bottom face for pockets and slots or a top face for islands. The method may mark the remaining feature faces as lateral faces. The method may check for co-edges between the bottom/top face and lateral faces, and make one or more sample points in this co-edge in operation 712.

Figure 13:
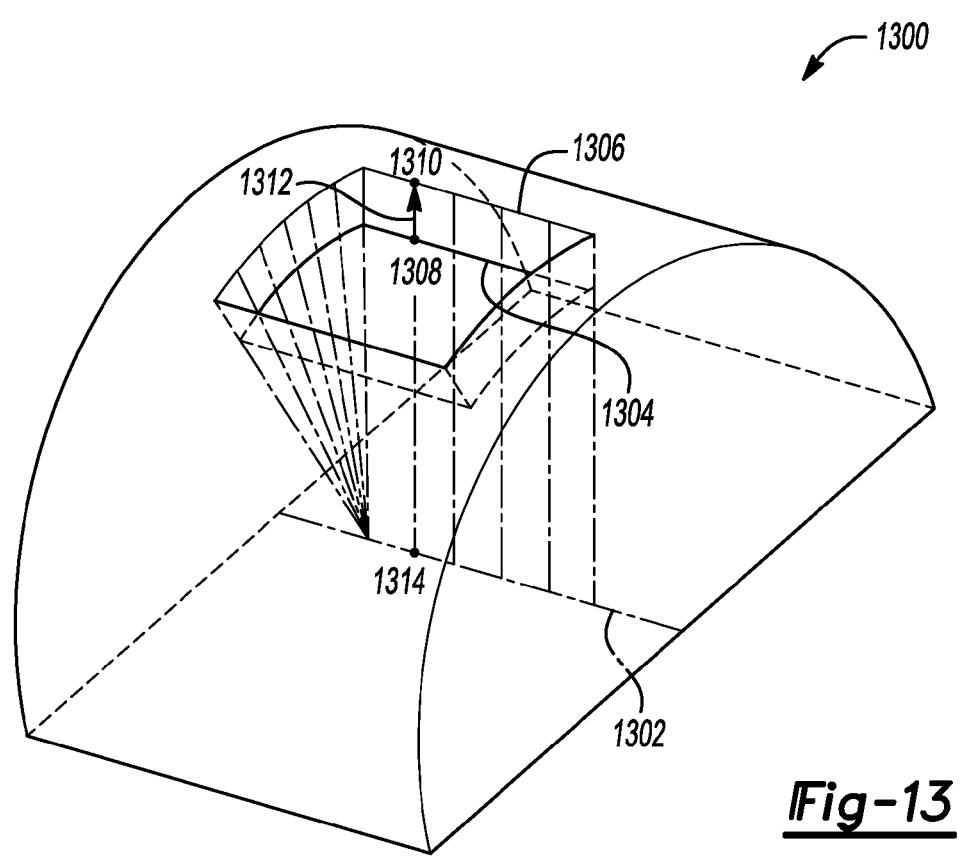
FIG. 13 is an example of a solid model comprising a c-axis pocket.

For example, FIG. 13 depicts a solid model comprising a c-axis pocket. In FIG. 13, the generic pockets are further processed to identify the bottom face and the lateral faces. The bottom face is identified from the feature faces, and only cylindrical faces are segregated first. Among the cylindrical faces are the faces that comprise the same axis as the part axis 1302 and are considered as bottom faces. All the remaining faces are marked as lateral faces. The lateral faces are checked by the method of identifying the co-edge 1304 that is shared between the bottom face and the lateral face.

In operation 714, the method may form a direction vector from all sample points to a nearest point on the nearest edge that is not directly connected to the co-edge. The methods may make a perpendicular projection of the sample points on the part axis and determine the projected point in operation 716.

Continuing from the generic pocket example in FIG. 13, the nearest edges that are not directly connected to co-edge 1304 are determined and tagged as reference edge 1306. The co-edge 1304 may be divided into a number of segments depending on the edge length such that each segment is an identified length. Vertices of these segments are taken as sample points and from each sample point the closest point on the reference edge 1306 may be determined. The closest point may be directly obtained by a geometric kernel application programming interface. A direction vector 1312 may be formed between sample point 1308 and closest point 1310. A perpendicular projection of a sample point 1308 on the part axis may be made and the projected vertex 1314 may be determined.

In operation 718, the methods may check whether the direction vector 1312, the projected vertex 1314 and the part axis 1302 are coplanar. Operations 714, 716 and 718 are performed for all sample points. If all sample points in the lateral faces pass the co-planarity check, then it passes C-axis check, otherwise it fails C-axis check in operation 720. For example, for a pocket to qualify as a C-axis pocket, all the sample points in all the lateral faces should pass the C-axis check. For C-axis islands and slots also, the same procedure as explained above is adopted for determining top face in case of islands and bottom face in case of slots. The C-axis check for lateral faces is the same method 700 for pockets, islands and slots.

In operation 722, the method may tag the feature as a generic C-axis feature if it passes the C-axis check. The method may tag the feature as a non-c-axis feature if it fails the C-axis check in operation 724. The output of the C-axis feature recognition module may be transmitted to the feature recognition method.

For example, FIG. 12 depicts a three-dimensional view of a solid model 1200 that contains a revolved part with a revolved feature comprising pockets, islands, and a slot. The feature recognition method identifies the revolved part comprising generic C-axis pockets 1204, 1206, 1208, a generic C-axis slot 1202, and generic C-axis islands 1210, 1212, 1214.

Figure 8:
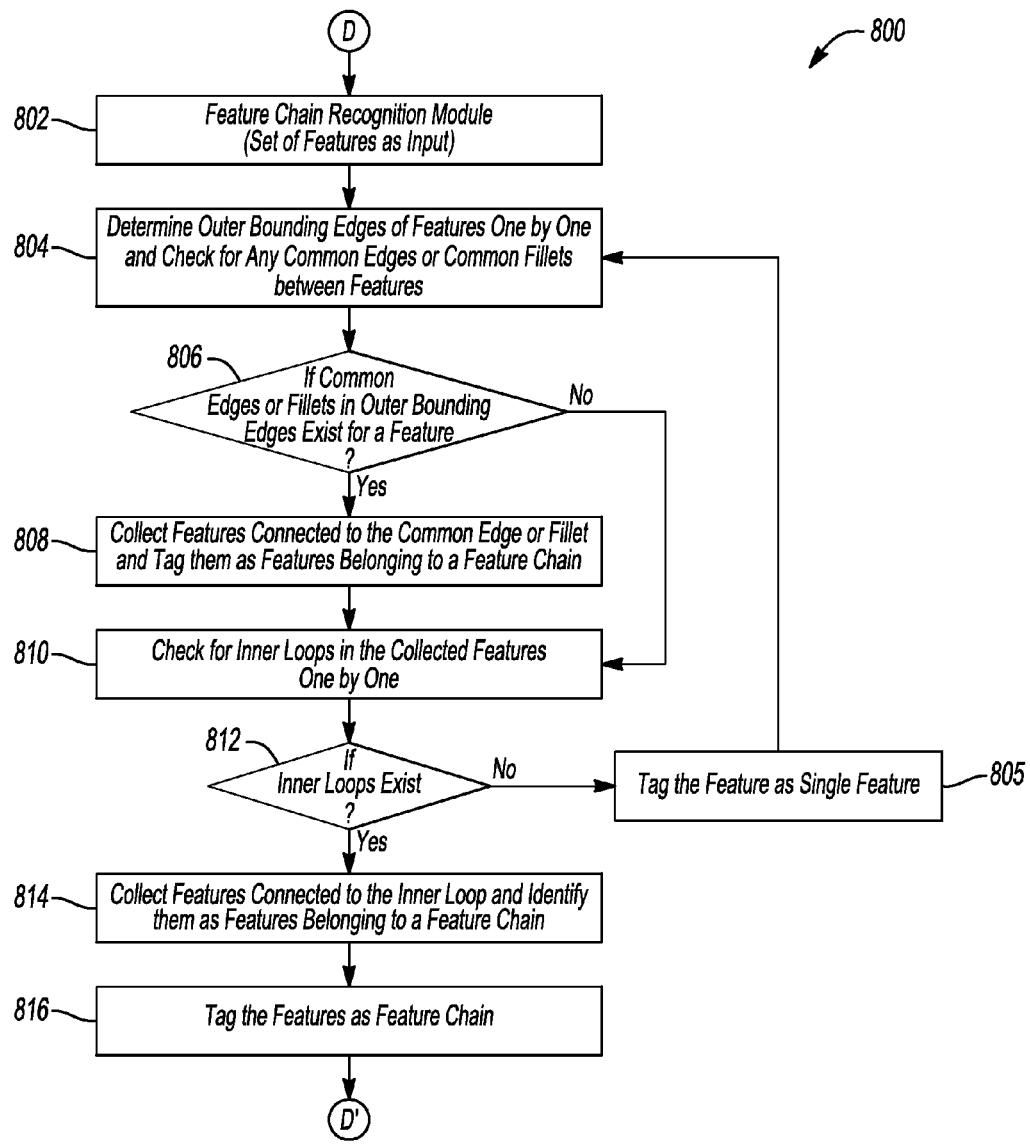
FIG. 8 is a flow chart of a feature chain recognition method.

FIG. 8 is a flow chart of a feature chain recognition method 800. The features may be adjacent to and/or implanted in one or more features as shown in FIG. 2. Such features are recognized as feature chains. The features such as generic pockets, generic islands, generic slots, and C-axis features are given as input to this method in operation 802.

In operation 804, the method may check the features one by one, determine outer bounding edges, and identify feature adjacency. The method to identify feature adjacency between features is determined by checking whether there is any common edge (e.g., fillet) shared by two or more features. In prior systems, a common edge between two or more features may not be identified because once an edge is identified as belonging to a particular feature, that edge or fillet can not be found to be associated with other features. It, for example, may be removed from a list of available edges free to identify as belonging to subsequently identified features, which may cause incomplete data being transmitted to other product development tools and/or additional machining steps to be taken for manufacturing the features.

The method may identify if common edges or fillets exist between outer bounding edges of features in operation 806. The method may check each feature one by one to determine outer bounding edges. If none of the outer bounding edges of a feature in a model have common edges or fillets with other features, or none of the feature faces have inner loops shared with other features, the method may tag the feature as a single feature in operation 805.

In operation 808, if the common edges or fillets exist in the outer bounding edges, the method may collect features connected to the common edge or fillet and tag them as features belonging to a feature chain.

In operation 810, the features that share inner loops with other features are also checked and considered as adjacent features. In all such cases, the features are collected as a single feature chain and the individual features are listed as child features. The method may check each feature one by one to determine if an inner loop exists in operation 812.

In operation 814, the method may collect features connected to the inner loop and identify them as features belonging to a feature chain. The method may generate a tag for the identified features as the feature chain in operation 816.

For example, the features that lie inside other features can be of different types such as pockets inside a pocket, islands inside a pocket, islands inside an island, pockets inside an island, pockets inside a slot and islands inside a slot. These pockets and islands are initially identified separately by the inner loop method and slots are identified by an edge-concavity method and listed as feature chains as these features contain an inner loop connected to another pocket or island feature. There are cases in which a slot is adjacent to another slot and listed as feature chains as these features share common edges or fillets in the feature boundary.

Figure 9:
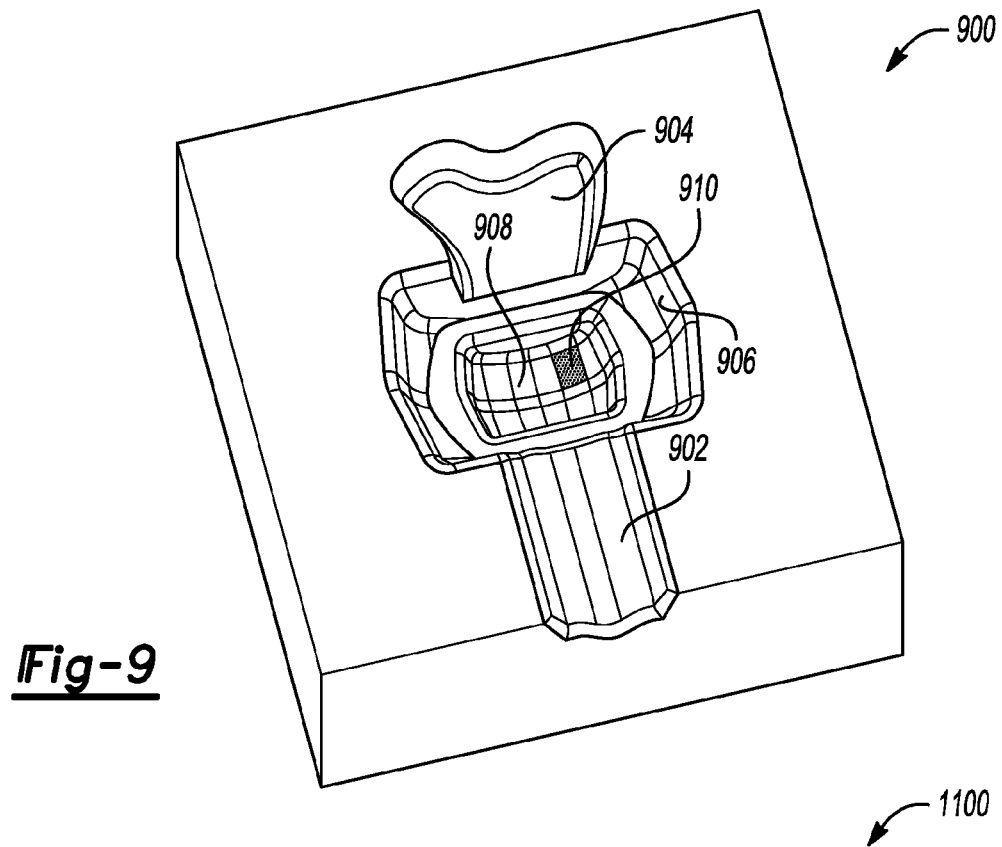
FIG. 9 is a three-dimensional view of a solid model that contains a feature chain.

FIG. 9 is a three-dimensional view of a solid model 900 that contains a three-dimensional feature chain. The feature recognition method may receive the solid model 900 and determine that the solid model 900 comprises a feature chain consisting of four features including a first slot 902, a second slot 904, a third slot 906, and a first blind pocket 908 inside the third slot 906. The feature recognition method may identify that the model comprises three features 902, 904, 906 that are adjacent to each other. The feature recognition method may recognize that another feature, the first bind pocket 908, is connected to an inner loop of one of the feature faces of the third slot 906. The feature recognition model may output a parent child relationship that includes a label for the first blind pocket 908 as a child designation of the third slot 906 in the feature chain. The feature recognition method identifies few convex fillets as a part of the first slot 902 and the third slot 906. The method may recognize convex fillets as part of one more features.

Figure 14:
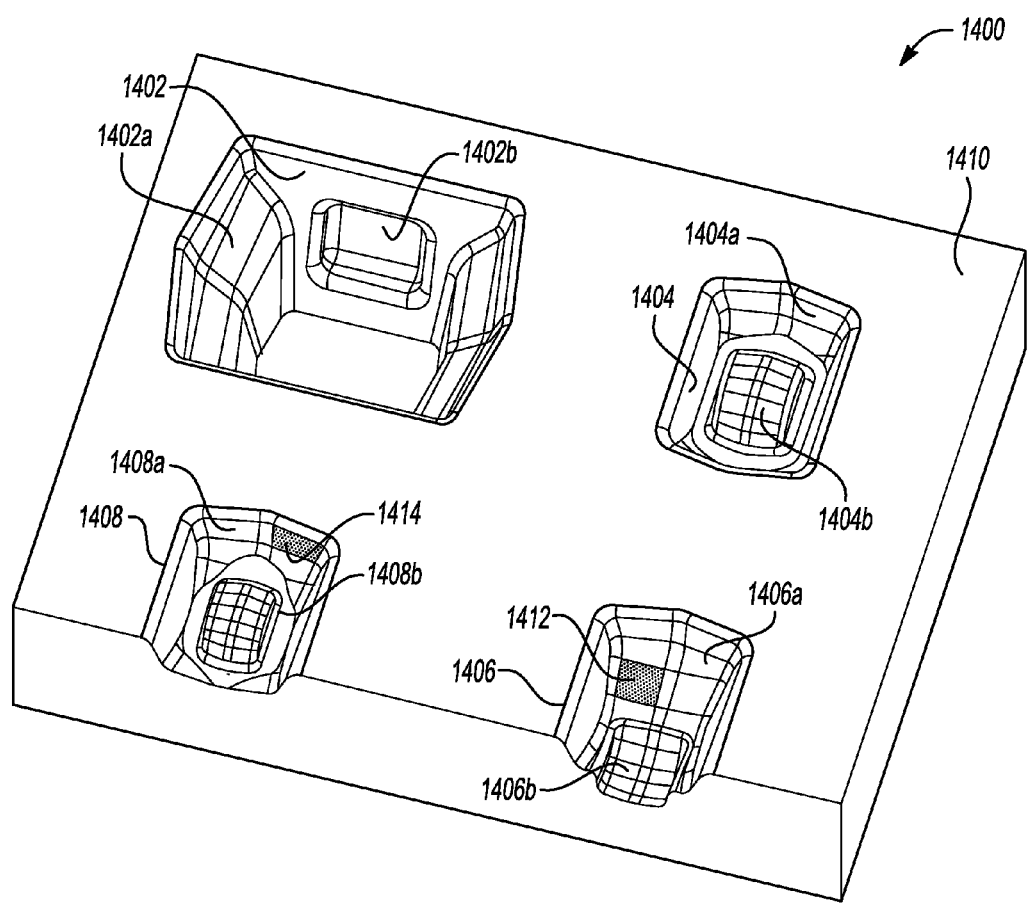
FIG. 14 is a three-dimensional view of a solid model that contains various cases of feature chains.

FIG. 14 is a three-dimensional view of a solid model 1400 that comprises common fillet feature chains. The solid model 1400 includes feature chains 1402, 1404, 1406 and 1408 comprising two or more features.

The feature recognition method may identify a first feature chain 1402 including a generic through pocket 1402a and a generic blind pocket 1402b. The two generic pockets 1402a, 1402b are adjacent to each other through an inner loop, and both are clubbed as a single feature chain.

The feature recognition method may identify a second feature chain 1404 including a generic blind pocket 1404a and a generic island 1404b. The feature recognition method may identify a third feature chain 1406 consisting of two generic slots 1406a and 1406b. The feature recognition method may identify a fourth feature chain 1408 consisting of a generic slot 1408a and a generic island 1408b.

Figure 10A:
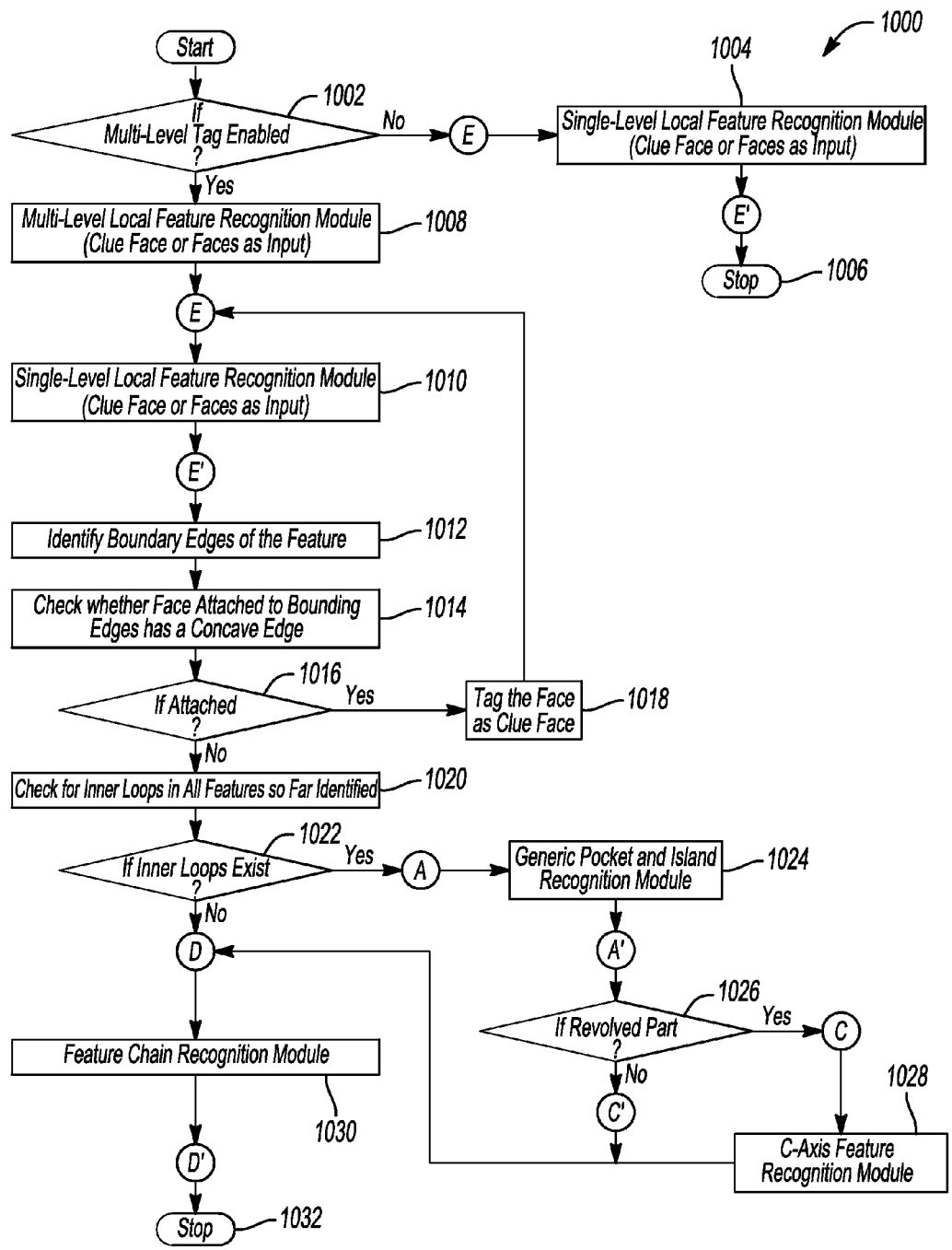
FIGS. 10A-10B are flow charts illustrating a local feature recognition method.
Figure 10B:
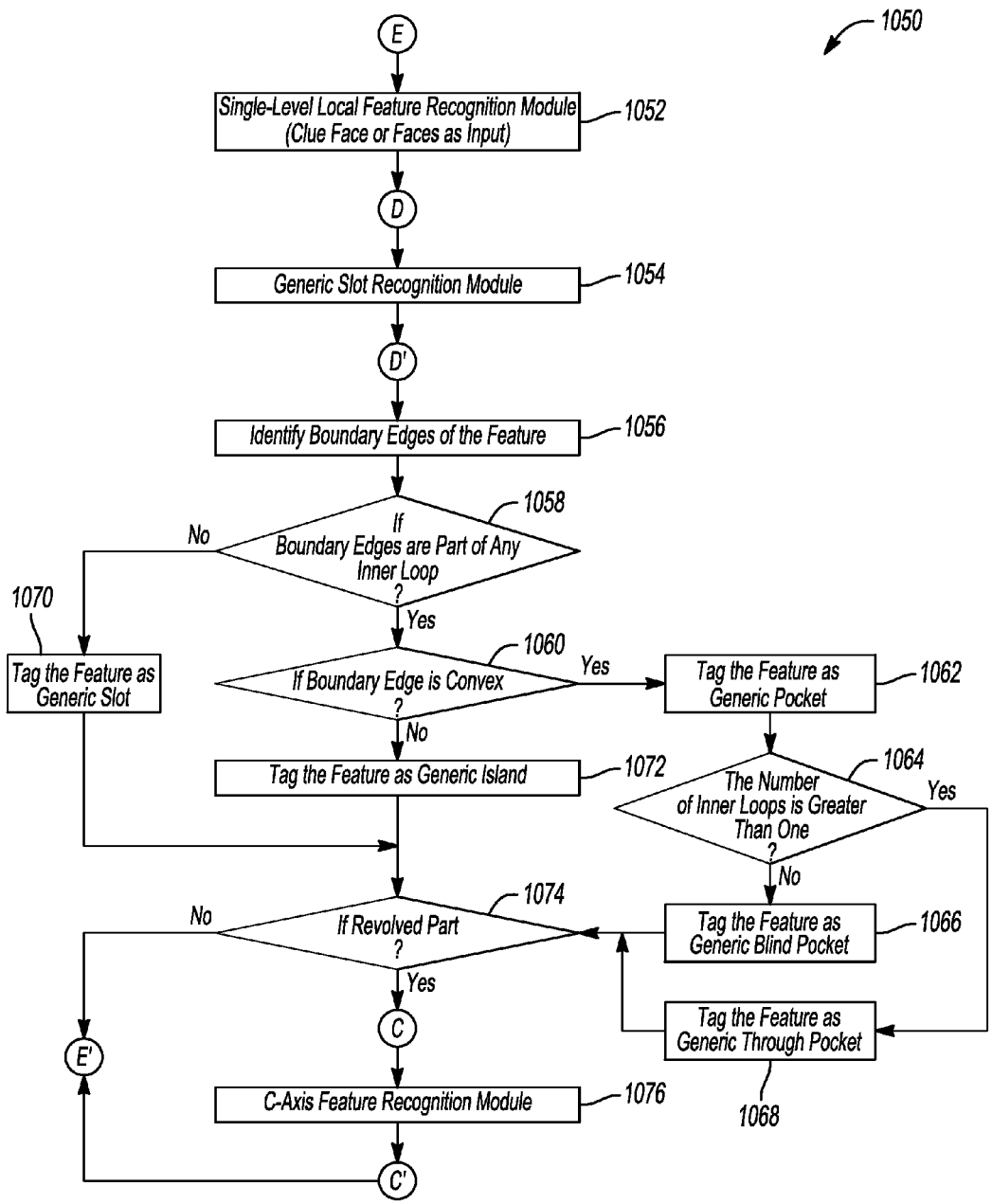

FIGS. 10A-10B are flow charts illustrating a local feature recognition method. The feature recognition method may include a local feature recognition method that may take a set of faces or a single face from three-dimensional model data in a B-rep format to recognize features. Automatic feature recognition works by taking the whole model as input and recognizes all the features.

Automatic feature recognition requires models to be accurate as recognition of most of the features depends on face adjacency information. Though face adjacency is disrupted in few regions of the part (e.g., model), there could be features in other areas which could be recognized. This would require a semi-interactive way to recognize features in unaffected regions of the three-dimensional model. Also, there is a need from industry to recognize certain features in a semi-interactive way. This kind of approach is helpful for parts that require multiple machining strategies involving different machines and processes, such as a part that requires a few features to be machined via milling and a few other features to be machined via electro discharge machining (EDM). To cater to these requirements, a local feature recognition approach has been described in this disclosure.

Local feature recognition works by taking a set of faces or a single face as input. These input faces are clue faces for local feature recognition and are used for recognizing features that contain clue faces as feature faces. In local feature recognition, there are two options: single-level recognition and multi-level recognition. In single-level local feature recognition, features containing only the clue faces are recognized, whereas in multi-level local feature recognition, a feature chain containing the clue faces is recognized. It may be a requirement for local feature recognition, in certain circumstances, that the clue face or clue faces contain at least one concave edge for effective local feature recognition.

In operation 1002, the local feature recognition method 1000 may determine if the multi-level tag or single level tag is being requested. In single-level local feature recognition, the clue faces are initially sent to the generic slot recognition module in operation 1004.

As illustrated in FIG. 10B, the single-level feature recognition method 1050 may receive a clue face(s) as input in operation 1052. The generic slot is recognized by checking whether any concave edges are attached to the clue face and collecting feature faces as explained in the generic slot recognition module method in operation 1054. Irrespective of whether a feature is a slot or pocket or island, this method initially recognizes all types of features as generic slots. Then these generic slots are further analyzed to recognize generic pockets and islands as follows. The single-level feature recognition method may identify boundary edges of the feature in operation 1056. If the bounding edges are part of any inner loop in the model, then the feature could be either a pocket or an island in operation 1058. If the boundary edges are not part of any inner loop, the method may tag the feature as a generic slot in operation 1070.

In operation 1060, the method may determine if the boundary edge is convex or concave. The feature is classified as a generic pocket if bounding edges are convex in operation 1062. The method may classify the feature as a generic island if the bounding edges are concave in operation 1072.

In operation 1064, the method may determine whether the number of inner loops is greater than one. For generic pockets if the feature faces are connected to one inner loop, the feature is classified as a blind pocket in operation 1066. If the feature faces are connected to one or more inner loops, the feature is classified as a through pocket in operation 1068.

In operation 1074, if the revolved part tag is on before recognizing a local feature, then slots, pockets and island features are further processed in the generic C-axis feature recognition module. The C-axis feature recognition module may further classify these features into C-axis features as explained in the C-axis feature recognition module in operation 1076.

In operation 1008, as illustrated in FIG. 10A, if the multi-level tag is selected the method may enable the multi-level local feature recognition; a feature chain connected to clue faces is recognized as follows. Initially the feature containing the clue faces is identified using single-level local feature recognition in operation 1010.

In operation 1012, the bounding edges of the feature are identified by the local feature recognition method 1000. The identified boundary edges are checked to determine whether any of the faces attached to these bounding edges have any concave edges in operation 1014.

In operation 1016, if a concave edge is found, then the method 1000 may tag the face. The tagged face having the concave edge may be assigned by the method 1000 as a clue face in operation 1018. The method may continue to execute the single-level local feature recognition until all concave edges have been identified. This process may be performed recursively until there are no other adjacent faces having any concave edges in operation 1016.

In operation 1020, the method checks for inner loops in the feature faces. The method may determine if inner loops exist in the feature in operation 1022. If an inner loop exists, the method may 1000 recognize the features connected to these inner loops using the generic pocket and island recognition module in operation 1024.

In operation 1026, the method 1000 may determine if the feature is a revolved part. If a revolved part, the pocket and island features are further processed in the generic C-axis feature recognition module in operation 1028. The C-axis feature recognition module may further classify these features into C-axis features as explained in the C-axis feature recognition module.

In operation 1030, the method may process all the recognized features in the feature chain recognition module to recognize feature chain and parent child information. The local feature recognition method may output one or more items including feature information and a parent child relationship of the feature chain in operation 1032.

For the solid model 900 shown in FIG. 9, the local feature recognition method may receive face 910 as a clue face and upon executing single-level local feature recognition, recognize only a blind pocket feature 908. Upon executing multi-level local feature recognition with the clue face 910, the method may recognize a feature chain consisting of four features including a first blind pocket 908, a first slot 906, a second slot 904, and a third slot 902.

For the solid model 1400 as shown in FIG. 14, the local feature recognition method may receive face 1410 as a clue face and upon executing single-level local feature recognition, the method may recognize none of the features as the face 1410 does not have any concave edges attached to it.

Upon executing the multi-level local feature recognition with the clue face 1410, the method may recognize two feature chains 1402 and 1404 based on inner loops in the clue face. The multi-level local feature recognition method with clue face 1410 may identify a first feature chain 1402 consisting of a generic through pocket 1402*a* and a generic blind pocket 1402*b*. The multi-level local feature recognition method may further identify a second feature chain 1404 consisting of a blind pocket 1404*a* and a generic island 1404*b*.

For the same solid model 1400 as illustrated in FIG. 14, the local feature recognition method may receive face 1412 as a clue face. Upon executing the single-level local feature recognition for face 1412 as the clue face, the method may recognize only a generic slot feature 1406*a*. Whereas upon multi-level local feature recognition with clue face 1412, it may recognize a feature chain 1406 containing two generic slot features 1406*a* and 1406*b*. The model 1400, however, actually contains four feature chains 1402, 1404, 1406 and 1408. If the user intends to recognize all the feature chains 1402, 1404, 1406 and 1408, then the user may recognize these features in two methods. One method is to execute multi-level local feature recognition once with three clue faces 1410, 1412 and 1414 selected. Another method is to execute multi-level local feature recognition three times, each time with a single clue face 1410, 1412 and 1414 respectively.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes can include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. A computer-implemented product including instructions embodied in a non-transitory computer read-able medium that, when executed by a processor, cause the processor to:
   in response to input defining a boundary representation model of an object,
   identify boundary edges of the model outside one of the faces not separated from the one of the faces by an intervening concave or convex edge, the boundary edges defining a perimeter of a topological feature containing the one of the faces,
   identify a set of the faces, including the one of the faces, contained by the perimeter, and
   generate output highlighting the boundary edges and set of the faces of the topological feature.

2. The computer-implemented product of claim 1 further including instructions embodied in the non-transitory computer read-able medium that, when executed by the processor, cause the processor to, in response to any of the boundary edges being convex and forming an inner loop, tag the boundary edges and set of the faces as belonging to a pocket.

3. The computer-implemented product of claim 1 further including instructions embodied in the non-transitory computer read-able medium that, when executed by the processor, cause the processor to, in response to any of the boundary edges being concave and forming and inner loop, tag the boundary edges and set of the faces as belonging to an island.

4. The computer-implemented product of claim 1 further including instructions embodied in the non-transitory computer read-able medium that, when executed by the processor, cause the processor to, in response to the boundary edges not forming an inner loop, tag the boundary edges and set of the faces as belonging to a slot.

5. The computer-implemented product of claim 1, wherein the boundary edges are fillets or chamfers.

6. The computer-implemented product of claim 1 further including instructions embodied in the non-transitory computer read-able medium that, when executed by the processor, cause the processor to, in response to the boundary edges and set of the faces of the topological feature comprising at least one face that is cylindrical and that has a same axis as the topological feature, tag the topological feature as a cylindrical feature.

7. The computer-implemented product of claim 1 further including instructions embodied in the non-transitory computer read-able medium that, when executed by the processor, cause the processor to:
  identify boundary edges for one or more chained topological features of the model having a shared face among the plurality of faces;
  tag the one or more chained topological features as being common; and
  in response to tagged as being common faces, highlight both topological features having common faces as feature chain.

8. The computer-implemented product of claim 7, wherein the one or more chained topological features include a slot, pocket, island, or c-axis.

9. A computer-aided design tool comprising:
  at least one processor programmed to
    receive input selecting one of a plurality of faces of a boundary representation model of an object; and
    in response to the input,
      identify boundary edges of the model outside the one of the faces not separated from the one of the faces by an intervening concave or convex edge, the boundary edges defining a perimeter of a topological feature containing the one of the faces,
      identify a set of the faces, including the one of the faces, contained by the perimeter, and
      generate output highlighting the boundary edges and set of the faces of the topological feature.

10. The computer-aided design tool of claim 9, wherein the processor is further programmed to, in response to any of the boundary edges being convex and forming an inner loop, tag the boundary edges and set of the faces as belonging to a pocket.

11. The computer-aided design tool of claim 9, wherein the processor is further programmed to, in response to any of the boundary edges being concave and forming and inner loop, tag the boundary edges and set of the faces as belonging to an island.

12. The computer-aided design tool of claim 9, wherein the processor is further programmed to, in response to the boundary edges not forming an inner loop, tag the boundary edges and set of the faces as belonging to a slot.

13. The computer-aided design tool of claim 9, wherein the boundary edges are fillets or chamfers.

14. The computer-aided design tool of claim 9, wherein the processor is further programmed to, in response to the boundary edges and set of the faces of the topological feature comprising at least one face that is cylindrical and that has a same axis as the topological feature, tag the topological feature as a cylindrical feature.

15. The computer-aided design tool of claim 9, wherein the processor is further programmed to
  identify boundary edges for one or more chained topological features of the model having a shared face among the plurality of faces;
  tag the one or more chained topological features as being common; and
  in response to user input selecting one of the chained topological features tagged as being common, generate output highlighting the other of the chained topological features tagged as being common.

16. The computer-aided design tool of claim 15, wherein the one or more chained topological features include a slot, pocket, island, or c-axis.

17. A computer-implemented product including instructions embodied in a non-transitory computer read-able medium that, when executed by a processor, cause the processor to
  generate a list of faces comprising a solid model;
  identify boundary edges for a plurality of topological features of the solid model from the list of faces;
  identify at least one of the boundary edges as being shared among the topological features;
  in response to identifying at least one of the boundary edges as being shared, identify the topological features as being common; and
  in response to tagged common topological features, highlight both topological features tagged as being common.

18. The computer-implemented product of claim 17, further including instructions embodied in the non-transitory computer read-able medium that, when executed by the processor, cause the processor to, in response to any of the boundary edges being convex and forming an inner loop, tag the inner loop and corresponding faces from the list of faces as belonging to a pocket.

19. The computer-implemented product of claim 17 further including instructions embodied in the non-transitory computer read-able medium that, when executed by the processor, cause the processor to, in response to any of the boundary edges being concave and forming and inner loop, tag the inner loop and corresponding faces from the list of faces as belonging to an island.

20. The computer-implemented product of claim 17 further including instructions embodied in the non-transitory computer read-able medium that, when executed by the processor, cause the processor to, in response to the boundary edges not forming an inner loop, tag the boundary edges and corresponding faces from the list of faces as belonging to a slot.

* * * * *

UNITED STATES PATENT AND TRADEMARK OFFICE
CERTIFICATE OF CORRECTION

PATENT NO. : 9,886,529 B2
APPLICATION NO. : 14/471666
DATED : February 6, 2018
INVENTOR(S) : Thoguluva Ramamoorth Kannan et al.

Page 1 of 1

It is certified that error appears in the above-identified patent and that said Letters Patent is hereby corrected as shown below:

In the Claims

Column 19, Line 29, Claim 7:
After "in response to tagged"
Delete "as being".

Column 19, Line 57, Claim 11:
After "boundary edges being concave and forming"
Delete "and" and
Insert -- an --.

Column 20, Line 51, Claim 19:
After "boundary edges being concave and forming"
Delete "and" and
Insert -- an --.

Signed and Sealed this
Nineteenth Day of June, 2018

Andrei Iancu
*Director of the United States Patent and Trademark Office*